(12) United States Patent
Houle et al.

(10) Patent No.: US 7,654,433 B2
(45) Date of Patent: *Feb. 2, 2010

(54) FLUX OVERSPRAY REMOVAL MASKS WITH CHANNELS, METHODS OF ASSEMBLING SAME, AND SYSTEMS CONTAINING SAME

(75) Inventors: Sabina J. Houle, Phoeniz, AZ (US); Joel Williams, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 242 days.

This patent is subject to a terminal disclaimer.

(21) Appl. No.: 11/612,642

(22) Filed: Dec. 19, 2006

(65) Prior Publication Data

US 2008/0145540 A1 Jun. 19, 2008

(51) Int. Cl.
*B23K 1/20* (2006.01)
*B23K 20/14* (2006.01)
(52) U.S. Cl. .............................. 228/41; 228/33; 228/223
(58) Field of Classification Search .................... 228/33, 228/39, 41; 148/DIG. 26; 216/41, 45, 47; 427/310–313; 118/301, 50, 505, 602–603, 118/501, 503
See application file for complete search history.

(56) References Cited

U.S. PATENT DOCUMENTS 4,893,403 A * 1/1990 Heflinger et al. .............. 29/840
2008/0145541 A1 * 6/2008 Williams et al. ............ 427/282

OTHER PUBLICATIONS

Definition of "rail" from Merriam-Webster's Online Dictionary.*

* cited by examiner

*Primary Examiner*—Jessica L. Ward
*Assistant Examiner*—Megha Mehta
(74) *Attorney, Agent, or Firm*—Schwegman, Lundberg & Woessner, P.A.

(57) ABSTRACT

Some embodiments include an apparatus comprising a spray head to spray a substrate, the substrate having a region to be sprayed and a region to be masked, the two regions separated by a boundary, and a mask having channels, the mask located between the spray head and the substrate. In an embodiment, the mask further has a lip to prevent flux overspray from falling onto a substrate below. In an embodiment, flux overspray removal is assisted with a vacuum system. Other embodiments are described and claimed.

28 Claims, 15 Drawing Sheets

FLUX OVERSPRAY REMOVAL MASKS WITH CHANNELS, METHODS OF ASSEMBLING SAME, AND SYSTEMS CONTAINING SAME

TECHNICAL FIELD

Embodiments relate generally to integrated circuit fabrication. More particularly, embodiments relate to flux overspray removal and collection in connection with microelectronic devices.

TECHNICAL BACKGROUND

In the field of electronics there is competitive pressure among manufacturers to drive the performance of their equipment up while driving production costs down and maintaining acceptable yield and reliability. This is especially true for packaging of dice on substrates, where problems with flux overspray reduce yield and/or increase throughput time.

Flux overspray causes non-uniform thickness on a substrate bump field, resulting in die misalignment during reflow. Non-uniform thickness in the solder bump region may also cause non-wetting of solder bumps. Additionally, if excess flux extends onto die-side lands, the solder paste may also be contaminated. Such problems lead to reduced yield, as misaligned dice are typically scrapped.

BRIEF DESCRIPTION OF THE DRAWINGS

In order to depict the manner in which the embodiments are obtained, a more particular description of embodiments briefly described below will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to flux overspray removal masks designed for use with or without a vacuum system. Embodiments also relate to methods of assembling flux overspray removal masks. Embodiments also relate to systems containing flux overspray removal masks with or without a vacuum system.

The following description includes terms, such as upper, lower, first, second, etc. that are used for descriptive purposes only and are not to be construed as limiting. The embodiments of an apparatus or article described herein can be manufactured, used, or shipped in a number of positions and orientations.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

Figure 1A:
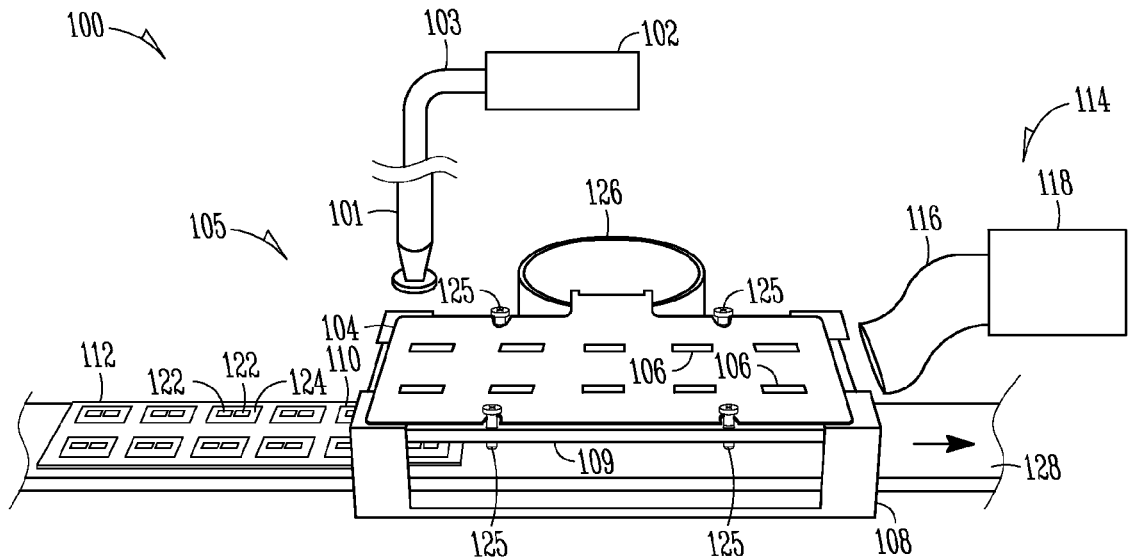
FIG. 1A is a perspective front view of a spraying operation using a mask with channels and a vacuum system in an embodiment.
Figure 1B:
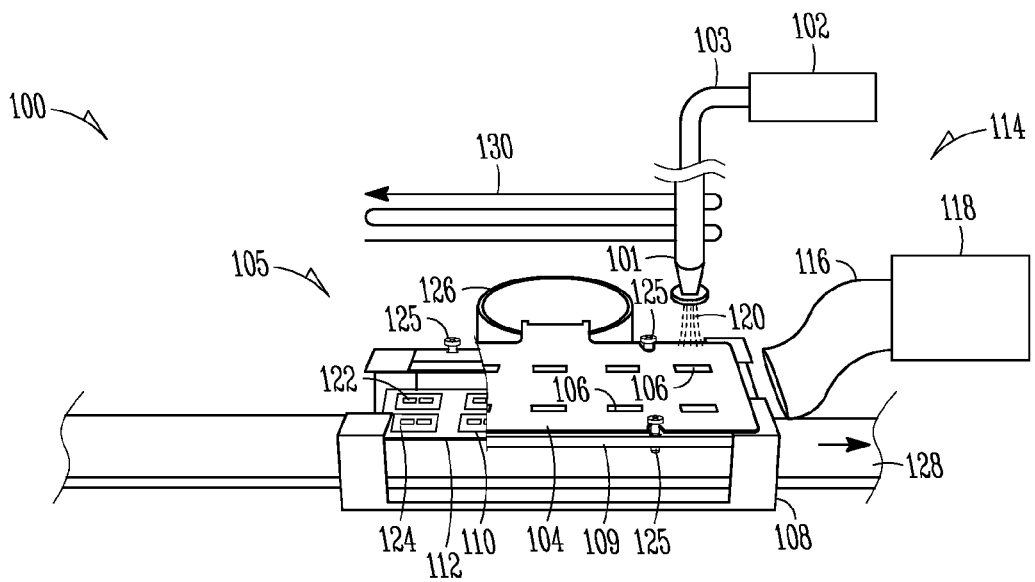
FIG. 1B is a perspective front view of the spraying operation of FIG. 1A at a different point in time in an embodiment.

FIGS. 1A and 1B show perspective front views of one embodiment of a spraying operation at different points in time. In this embodiment, the spraying operation uses a spraying system 100 which includes a spray station 105 and a transport element or belt 128. The spray station 105 may include a spray head 101, a mask 104 with a plurality of openings 106, a support element (commonly referred to as a "tool") 108 and a vacuum system 114. The spray head 101 draws spray flux from a spray source 102 via a spray tube 103. The tool 108 includes a rail 109 to support the mask 104 during the spraying operation. The vacuum system 114 comprises a suction hose 116 and a vacuum pump 118. The spraying system 100 allows for a spraying medium, such as a spray flux 120 (shown in FIG. 1B), to be sprayed onto unmasked areas 122 on a substrate 110, transported along the belt 128 on a carrier 112, while preventing flux overspray onto masked or no-spray areas 124 on the substrate 110.

Figure 2:
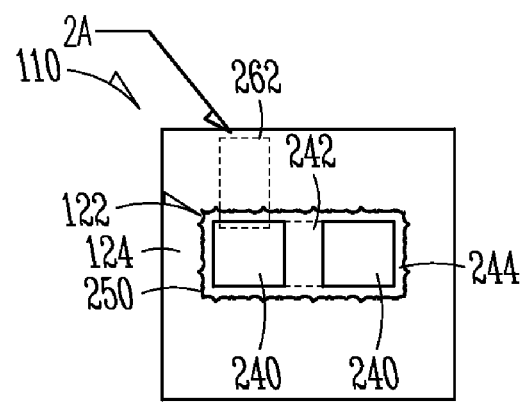
FIG. 2 is a top view of a substrate having a spray boundary in an embodiment.
Figure 2A:
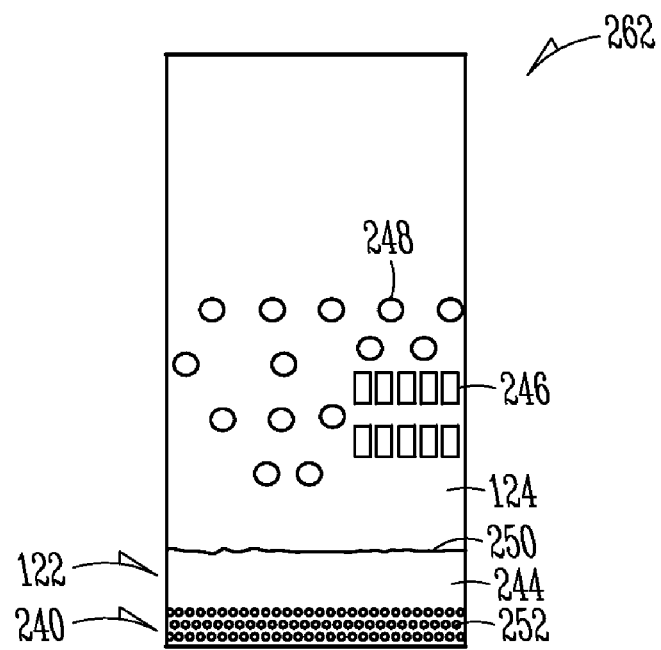
FIG. 2A is an enlarged view of a portion of the substrate in FIG. 2 in an embodiment.

The unmasked area 122 of each substrate 110 is shown in more detail in FIGS. 2 and 2A. In this embodiment, each unmasked area 122 includes dual die-bonding regions 240, a portion of substrate 110 located therebetween 242, and a border area 244 surrounding the dual die-bonding regions 240, as shown in FIG. 2. A substrate portion 262 is identified as the area shown in FIG. 2. FIG. 2A shows the substrate portion 262 in more detail. The substrate potion 262 includes a portion of the unmasked area 122 and a portion of one of the die-bonding regions 240. The border area 244 shown in FIGS. 2 and 2A is of a sufficiently small size so as not to interfere with components already present on the substrate 110, such as those located on substrate portion 262. Such components may include rectangular pads 246 and circular pads 248, as shown in FIG. 2A, or components added to the substrate 110 after the spraying operation. The unmasked area 122, i.e., region to be sprayed, and masked area 124, i.e., no-spray area, are separated by a boundary 250 as shown in FIGS. 2 and 2A. The boundary may be irregular in configuration, such as the boundary 250 shown in FIGS. 2 and 2A. In most embodiments, a portion of each mask 104 (shown in FIGS. 1A and 1B) contacts its respective substrate 110 along at least a portion of the boundary 250. In an embodiment, a portion of each mask 104 (shown in FIGS. 1A and 1B) contacts its respective substrate 110 along substantially all or all of the boundary 250. In the embodiment shown in FIG. 2A, the dual die-bonding areas 240 have solder balls 252 located thereon. In other embodiments, the masked areas 124 may include any surface which should not be sprayed. Additionally, the unmasked areas 122 may include any surface to be sprayed, including a surface having fewer or more than two die-bonding areas 240.

Referring again to FIGS. 1A and 1B, excess spray flux 120 (i.e., flux overspray) remaining on the top surface of the mask 104 may flow into a drain 126 for collection. Excess spray flux 120 remaining around the openings 106 may flow through channels (e.g., channels 549 in FIG. 5) located on an inner surface of the mask 104 and away from the openings 106. Excess spray flux 120 may then be stored in any suitable container, such as a container (not shown) associated with the drain 126. Additionally, excess spray flux 120 may also be directed away from the mask 104 and into the vacuum system 114 as described herein.

Figure 3A:
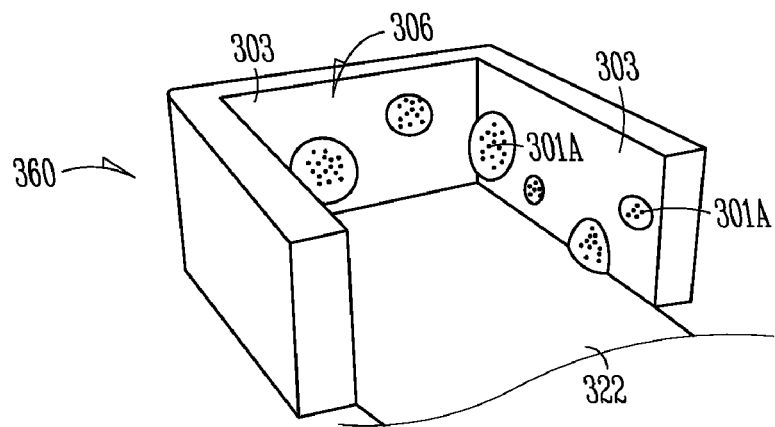
FIG. 3A is a cross-sectional view of a stencil element on an unsprayed substrate portion with prior buildup of spray flux on inner walls of the stencil element.
Figure 3B:
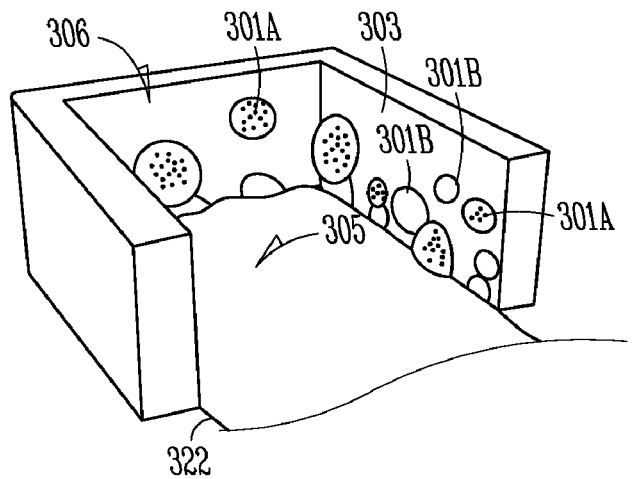
FIG. 3B is a cross-sectional view of the inner walls of the stencil element and substrate portion of FIG. 3A after the substrate portion has been sprayed with new spray flux.

In this way, as shown in FIG. 3A, any existing drips 301A from prior build-up do not accumulate on inner walls 303 of each opening in a mask, such as opening 306 in the stencil assembly 360. Such a stencil assembly 360 has drips 301A present and does not have any of the benefits described herein. Such benefits include, but are not limited to the benefit of having channels (e.g., channels 549 in FIG. 5) located on an inner surface of the mask 104, the benefit of vacuum assist as described herein, or the benefit of a lip, such as the lip 1385 shown in FIG. 13, all of which are useful in removing the drips 301A. Additionally, as shown in FIG. 3B, drips 301B from the current spray operation may accumulate on inner walls 303. Such drips 301B remain on the inner walls 303 of stencil assembly 360, and may fall down or blow onto the final flux pattern 305 shown in FIG. 3B. In contrast, the embodiments described herein have various benefits described above that are useful in removing the drips 301B.

Figure 4:
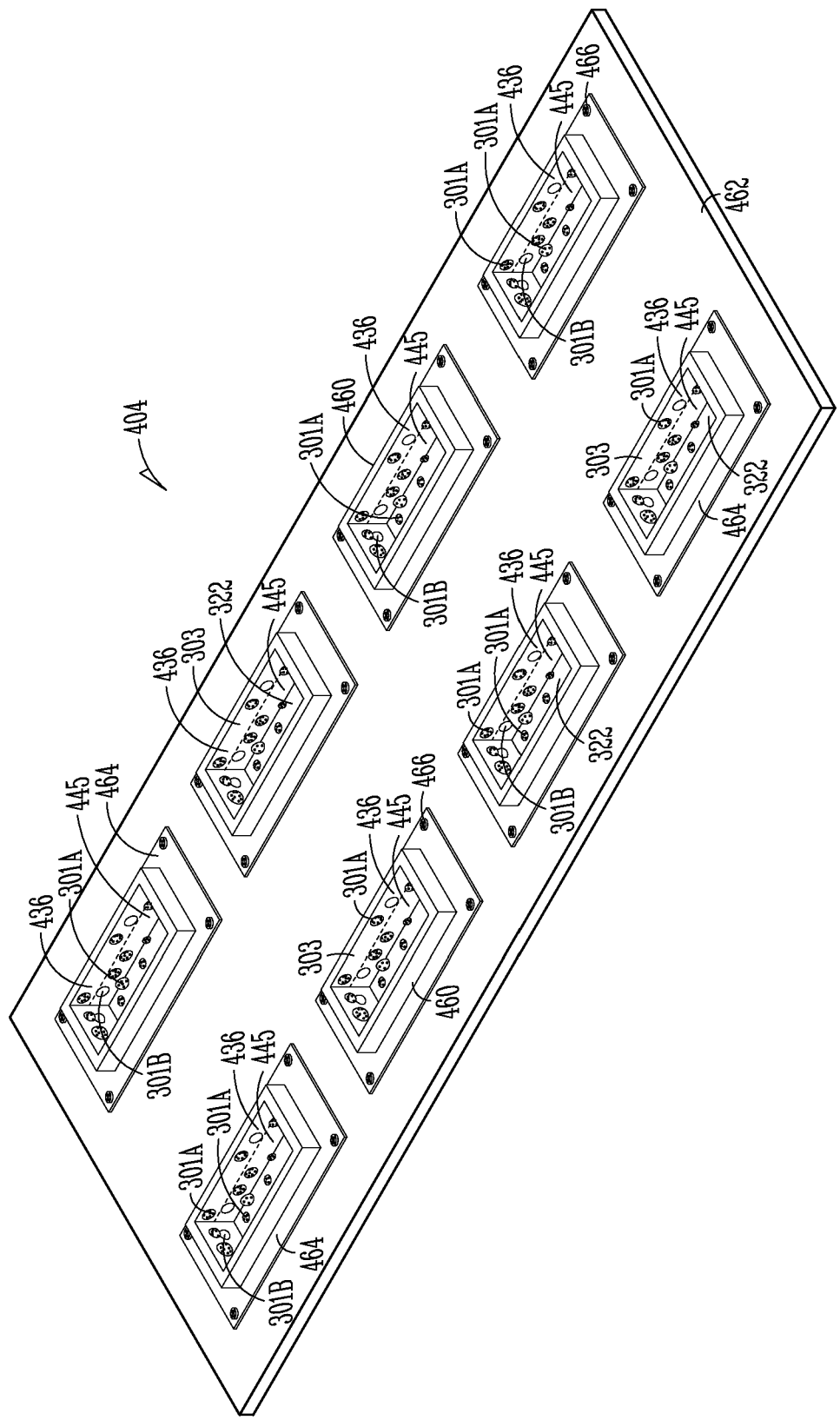
FIG. 4 is a perspective top view of a mask after being sprayed.

Such drips, 301A and 301B, may also accumulate on the inner walls 303 and unmasked area 322 of each stencil assembly 460 as shown in FIG. 4. FIG. 4 shows a mask 404 having multiple stencil assemblies 460, each secured to a mask support 462 individually with screws 466 which extend from an upper stencil assembly portion 464 to a lower stencil assembly portion (not shown). It is understood that the inner walls 303 in FIGS. 3A, 3B and 4 may be comprised of upper stencil assembly portion inner walls 436 which extend upwardly beyond the horizontal plane of the mask 404 and stencil element inner walls 445 aligned therewith and extending downwardly below the horizontal plane of the mask 404 as shown in FIG. 4.

Figure 3C:
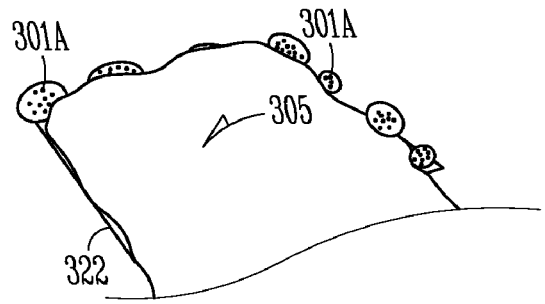
FIG. 3C is a schematic view of a final flux pattern on the substrate portion of FIG. 3B after removal of the stencil element of FIG. 3B.

FIG. 3B shows a portion of a final flux pattern 305. FIG. 3C shows the final flux pattern 305 of FIG. 3B with drips 301A having fallen onto the final flux pattern 305 located on the unmasked area 322 (i.e., from the inner walls 303 shown in FIG. 3B), thus causing non-uniform spray flux thickness and possible die misalignment. (See also drips 301A having fallen into the unmasked portions 322 in FIG. 4). Any such build-up of spray flux on each individual stencil assembly 360 or 460, including on the inner walls 303 as shown in FIGS. 3A and 3B, should be removed by cleaning or replacing the entire mask (e.g., 404 in FIG. 4), thus increasing throughput time.

Figure 5:
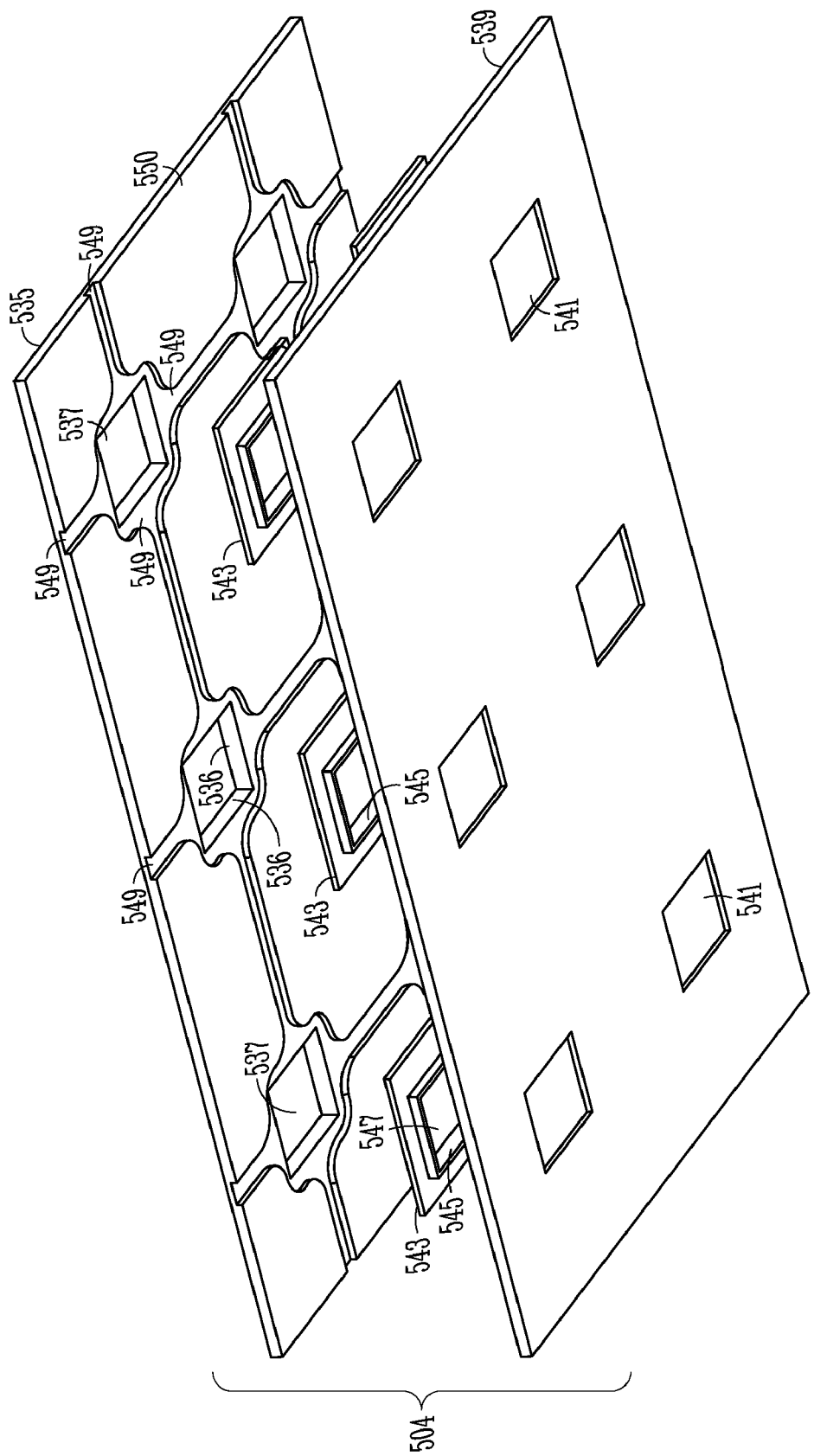
FIG. 5 is an exploded bottom view of a mask having channels in a top plate in an embodiment.

Use of channels, such as channels 549 shown in FIG. 5, reduces or eliminates the possibility of drips 301A and/or 301B falling off onto unmasked areas. Embodiments described herein also reduce or eliminate the possibility of drips, such as drips 301A and/or 301B in FIGS. 3A and 3B, from being blown off onto unmasked areas 322 and onto a subsequent substrate, when spraying additional spray flux thereon. Such blow-off of excess spray flux would also cause non-uniform spray flux thickness and possible die misalignment.

As shown in FIG. 5, embodiments described herein also have inner walls comprised of top plate opening inner walls 536 and stencil element opening inner walls. It is the stencil element opening inner walls 545 which are designed to be in contact with at least a portion of a boundary 250 between an unmasked area 122 and masked area 124 on a substrate 110 shown in FIGS. 1A, 1B and 2. In some embodiments, excess spray flux 120 may be prevented from falling off the inner walls 536 and 545 shown in FIG. 5 onto an unmasked area below (such as unmasked area 122 in FIG. 6) with use of a lip, such as the lip 1385 shown in FIG. 13. The lip 1385 is created around a portion or all of each opening 1306 by having at least a portion of the top plate opening, such as top plate opening 1337 shown in FIG. 13, larger than the stencil element opening 1347 and/or the bottom plate opening 1341.

Referring again to FIGS. 1A and 1B, the openings 106 are disposed within the mask 104 such that they form a pattern thereon. The openings 106 in the mask 104 correspond in position to the position of unmasked areas 122 on the substrate 110. In FIG. 1A, the mask 104 has already been affixed to the rail 109 on the tool 108 using connectors, such as the screws 125 shown in FIGS. 1A and 1B. In other embodiments, the mask 104 may be affixed to the tool 108 using any suitable means known in the art, including spring clips, such as the spring clips 625 shown in FIG. 6. In yet other embodiments, the mask 104 comprises individual stencil assemblies which are individually affixed to a mask support which is then affixed to the tool 108. See, for example, FIGS. 4 and 11. See also U.S. patent application Ser. No. 11/612,652, commonly assigned, filed on same date herewith, and entitled "Compliant Spray Flux Masks, Systems, and Methods."

In operation, the belt 128 moves the carrier 112 into place, i.e., into alignment with openings 106 in the mask 104. The tool 108 then lifts the carrier 112 and the substrates 110 located thereon into contact with the mask 104 as shown in FIG. 1B, using any suitable mechanism known in the art to raise and lower the carrier 112, such as any type of pneumatic, hydraulic, magnetic, and/or electromechanical lifter. In this way, the openings 106 in the mask 104 are aligned with the unmasked areas 122 on the substrate 110. While in this position, the spray head 101 passes back and forth in any suitable pattern, such as the pattern 130 shown in FIG. 1B, spraying a desired amount of spray flux 120 onto the surfaces below, i.e., the mask 104 and the unmasked area 122 of the substrate 110. The carrier 112 is then lowered by the tool 108 and continues moving the substrate 110 along the belt 128 in the same direction for further processing.

Excess spray flux 120 is handled via the drain 126 and with channels (shown, for example, in FIG. 5) in the mask 104 and/or with the vacuum system 114 as discussed herein. In operation, the vacuum system 114 may work continuously or intermittently as desired. In an embodiment, the vacuum system 114 may be automated. In another embodiment, the vacuum system 114 may be operated manually some or all of the time.

Any suitable size and number of suction hoses 116 and pumps 118 may be used for the vacuum system 114. In an embodiment, the suction hoses 116 (as well as any of the suction hoses described herein) may comprise one or more flexible hoses made from a polymeric-based material such as urethane, polyvinylchloride (PVC) and the like. The suction hoses 116 may be of any suitable inner and outer dimensions as long as they can perform the intended function. In an embodiment, the suction hoses 116 (as well as any of the suction hoses described herein) are circular in shape with a diameter of between about 0.125 and about 0.25 inches.

In most embodiments, the pump 118 includes storage capabilities for holding the excess spray flux 120, such as any suitably sized container. In an embodiment, the container associated with the vacuum pump may be a temporary holding container which may be drained continuously or intermittently into a larger holding container, such as any container (not shown) associated with the drain 126 in FIGS. 1A and 1B. In an embodiment, excess spray flux 120 entering the drain 126 flows into a temporary container which then feeds into a larger holding container, which may be the same container used with the vacuum system 114.

Any suitable type of vacuum pump may be used in the vacuum system 114, including vacuum pumps currently used in other processing areas for these or other components, together with any additional suction hoses as described herein. Suitable vacuum pumps may include, but are not limited to scroll pumps, rotary vane pumps, turbo pumps, belt drive vacuum pumps, direct drive vacuum pumps, dry pumps, diffusion pumps, rotary piston pumps, liquid ring pumps, ion pumps, and the like, and may further include vacuum boosters, and the like. In an embodiment, a centralized vacuum system is used with any suitable number of suction hoses which may, in turn, feed into one or more vacuum ports. Such vacuum ports may be a rigid or flexible tube or otherwise any type of opening sized appropriately to accommodate the suction hose or hoses. In an embodiment, a centralized vacuum system is used, such as a rotary piston pump vacuum system.

The substrate 110 may be made of any material. Materials commonly used in electrical applications include, but are not limited to, organic materials and ceramic materials. However, it is expected that embodiments of this system 100 could also be used on substrates of other materials. Furthermore, the unmasked areas 122 are not limited to dies or substrates associated with a package. A substrate may be any surface, including printed circuit boards or printed wire assemblies. Any suitable number of substrates 110 may be located on an individual carrier 112. In an embodiment, one or more substrates 110 are located on the carrier 112. In another embodiment, at least two (2) substrates 110, up to eight (8) or 12 substrates 110 are located on the carrier 112. In yet another embodiment, more than 12 substrates 110, such as up to 126 substrates 110 are located on the carrier 112. In other embodiments, more than 126 substrates 110 are located on the carrier 112. The number of openings 106 in the mask 104 may then be adjusted accordingly. In an embodiment, the number of openings 106 in the mask matches the number of substrates 110 provided on the carrier 112.

Any suitable spray flux 120 known in the art may be used in the spray head 101. In most embodiments, the spray flux 120 is sufficiently "sticky" so that components such as dice (240 in FIG. 2) remain in place after the spray flux 120 is applied. In most embodiments, the spray flux 120 further has sufficient chemical activity at elevated temperatures to remove oxide metal, such as on solder bumps, which ensures proper bonding during reflow. In most embodiments, the spray flux 120 is exposed to elevated temperatures in subsequent processing steps, such as up to about 240° C. In most embodiments, the spray flux 120 is cleanable, such that any residual spray flux 120 is removable with sprayed water, so that epoxy added in the next processing step has proper flow or capillary action throughout the bump areas. The spray flux 120 should have a viscosity sufficiently low so that it is sprayable at room temperature. In an embodiment, the spray flux 120 is sprayed on at a temperature between about 30° C. and about 60° C. In an embodiment, the spray flux 120 is sprayed on at a temperature between about 45° C. and 55° C. In a particular embodiment, the spray flux 120 is sprayed on at a temperature of about 38° C. In an embodiment, the spray flux 120 may have a higher viscosity and is sprayable at elevated temperatures. In an embodiment the spray flux 120 has a viscosity of between about two (2) Pascal seconds and about 0.1 Pascal second at ambient or room temperature. In an embodiment, spray flux from Kester, a company now wholly owned by Illinois Tool Works, Inc., having offices in Glenview, Ill. is used.

Use of channels (e.g., channels 549 in FIG. 5) as discussed herein may be shaped and located differently, depending on many factors, including the viscosity of the spray flux 120. Similarly, the optional vacuum system 112 discussed herein may also be adjusted in configuration depending on many factors, including the viscosity of the spray flux, with higher viscosity fluids requiring a stronger vacuum suction and/or additional suction hoses and/or differently located suction hoses.

In the embodiment shown in FIG. 5, a mask 504 comprises a top plate 535 having a plurality of top plate inner walls 536 surrounding a plurality of top plate openings 537 and a bottom plate 539 having a plurality of bottom plate openings 541. The mask 504 may be any suitable size and shape as is known in the art, depending on how many top plate openings 537 and bottom plate openings 541 are present. In an embodiment, the mask 504 has a substantially rectangular shape. In an embodiment, the mask 504 may be substantially square in shape. In an embodiment, the length of the mask 504 may vary from a few inches up to 14 inches or more in length. In an embodiment, the width of the mask 504 may vary from a few inches up to seven (7) inches or more in width. In an embodiment, the mask 504 is about 14 inches in length and about seven (7) inches in width and contains anywhere from one (1) or two (2) top plate openings 537 and bottom plate openings 541 up to about 120 top plate openings 537 and bottom plate openings 541 or more. In one embodiment, the mask contains about eight (8) to 12 top plate openings 537 and bottom plate openings 541. The top plate 535 and the bottom plate 539 may each be any suitable thickness, such as about 0.1 to about 0.4 inches.

In the embodiment shown in FIG. 5, the top plate inner walls 536 extend above the horizontal plane of a top surface of the top plate 535 a short distance, such as about 0.1 to about 0.5 inches. In other embodiments, the top plate inner walls 536 may be omitted or may extend a greater or lesser distance above the horizontal plane of the top plate 535. In the embodiment shown in FIG. 5, the bottom plate opening 541 does not include a wall extending above or below the horizontal plane of the bottom plate 539. In other embodiments, the bottom plate opening 541 may include a wall that extends above and/or below the horizontal plane of the bottom plate 539 for a suitable distance at any suitable angle. Each of the top plate openings 537 and the bottom plate openings 541 may also be any suitable size depending on the size of the area to remain unmasked. In an embodiment, the top plate openings 537 and the bottom plate openings 541 are about 0.4 to about two (2) inches in length and about 0.4 to about two (2) inches in width.

A plurality of stencil elements (commonly referred to as "inserts") 543, each having a plurality of inner walls 545 surrounding a stencil element opening 547, are located in between the top plate 535 and bottom plate 539. Each of the stencil elements 543 may also be any suitable size. In an embodiment, each stencil element 543 is about one (1) to two (2) in length, about 0.4 to about two (2) inches in width and about 0.1 to about 0.4 inches in thickness. Each stencil element opening 547 may also be of any suitable size, such as about 0.4 to about two (2) inches in length and about 0.4 to about two (2) inches in width. The inner walls 545 may be of any suitable size as long as they can perform their intended function. In one embodiment, the inner walls 545 extend below a bottom surface of the stencil element 543 about 0.06 to about 0.2 inches. In an embodiment, the inner walls 545 may also extend upward above a horizontal plane of a top surface of the stencil element 543 any suitable distance. (See FIG. 13).

Once assembled, the plurality of stencil elements 543 are essentially "sandwiched" in between the top plate 535 and bottom plate 539. When assembled, the inner walls 545 of each of the plurality of stencil elements 543 extend below the horizontal plane of a bottom surface of the bottom plate 539 a minimum distance that is greater than the thickness of existing solder paste (not shown) if no components are present or greater than the height of the tallest component present on the substrate 110 (See FIGS. 1A and 1B) during the spraying operation. In an embodiment, the inner walls 545 of each of the plurality of stencil elements 543 extend below the horizontal plane of the bottom surface of the bottom plate 539 about 0.01 to 0.05 inches. In an embodiment, the inner walls 545 extend below the horizontal plane of the bottom surface of the bottom plate 539 more than 0.05 inches, up to about 0.5 inches. In an embodiment, the inner walls 545 extend below the horizontal plane of the bottom surface of the bottom plate 539 more than 0.5 inches if appropriate for a particular application, such as with substrates 110 having taller components installed prior to the spray operation (See FIGS. 1A and 1B). In other embodiments, the inner walls 545 of the plurality of stencil elements 543 may be omitted. (See FIG. 18).

In the embodiment shown in FIG. 5, the top plate inner walls 536 and the plurality of inner walls 545 (of each stencil element 543) are substantially vertical, although in other embodiments, either or both may be at an angle greater or less than ninety degrees. Each opening 606 shown in FIGS. 1A and 1B (and in FIG. 6) may comprise the top plate opening 537, the bottom plate opening 541 and the stencil element opening 547. In other embodiments, each opening 106 (FIGS. 1A, 1B and 6) may comprise only the top plate opening 537 and the bottom plate opening 541. In an embodiment, each top plate opening 537 is larger than the respective stencil element opening 547 and bottom plate opening 541, thus forming a lip, such as lips 671 and 1371, shown in FIGS. 6 and 13, respectively.

The top plate 535, bottom plate 539 and stencil insert 543 may be made from any suitable material. In an embodiment, the top plate 535 and bottom plate 539 are injection molded using any suitable type of material, such as nylon or a polypropylene (PP)/polyethylene (PE) copolymer blend with or without glass/carbon reinforcement. In an embodiment, the stencil insert 543 may comprise any suitable non-stick, acid-resistant material, such as, but not limited to, nylon, urethane, or a thermoplastic elastomer (TPE). In an embodiment, stencil inserts may comprise material such as polytetrafluoroethylene (PTFE), fluorinated ethylene-propylene (FEP), and perfluoroalkoxy polymer resin (PFA), such as, but not limited to, those commercially available under the Teflon trademark. In an embodiment, stencil inserts may comprise a silicone elastomer, such as, but not limited to, those commercially available under the Silastic trademark. In an embodiment, stencil inserts may comprise a suitably plated or coated metal, plastic, or nylon. In an embodiment, stencil inserts may comprise stainless steel, either coated or uncoated. In an embodiment, stencil inserts may comprise a thermoplastic polymer, such as polypropylene. In an embodiment, the polypropylene or nylon material may contain glass. Adding a suitable coating to the stencil insert material may provide resistance to acid in the spray flux. (All of the top plates, bottom plates and stencil inserts described herein in the various figures may also be made of the aforementioned materials as well as any other suitable materials).

The top plate 535 and bottom plate 539 are joined together using any suitable type of connector or connectors. In an embodiment, the top plate 535 is a spring element having compliance which, together with any suitable connectors, such as screws, helps to hold the stencil elements 543 and bottom plate 539 to the tool 108, or in some embodiments, more specifically, the rail 109 of the tool 108 (shown in FIGS. 1A and 1B). In the embodiment shown in FIG. 6, the top and bottom plates of the mask 604 are connected with a plurality of spring clips 625 that further secure into the rail 109.

Referring again to FIG. 5, the stencil element 543 is designed to fit snugly between the top plate 535 and the bottom plate 539. Channels 549 on the bottom surface 550 in the top plate 535 may be designed to utilize gravity to assist with flowing excess spray flux (not shown) away from each top plate opening 537. In the embodiment shown in FIG. 5, the channels 549 are connected with, i.e., contiguous with one another, although in other embodiments the channels 549 may not be contiguous. In some embodiments, the channels 549 may drain into vacuum tunnels, suction hoses and/or other channels 549. (See FIGS. 6-10).

Figure 6:
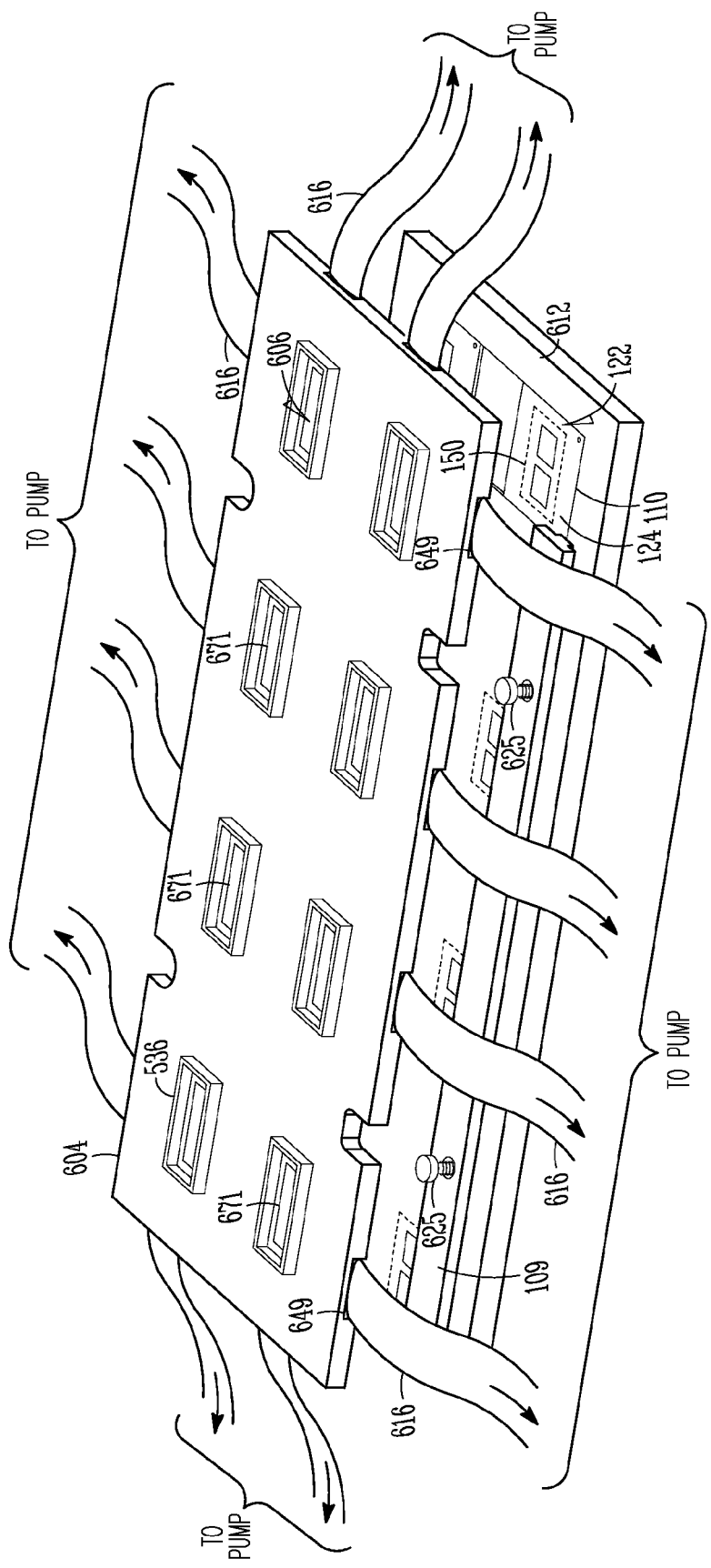
FIG. 6 is an exploded top view of a mask having channels, the mask connected to suction hoses and in position to be secured to a rail on a support element located above a substrate in an embodiment.

FIG. 6 is an exploded top view of a mask 604 having channels 649, the channels 649 proximate to suction hoses 616 and in position to be secured to the rail 109 located above a plurality of substrates 110 on a carrier 612. Each substrate 110 has an unmasked area 122 and a masked area 124 defined by a boundary 150 as discussed herein. Any suitable number of suction hoses 616 may be used to remove excess spray flux. In the embodiment shown in FIG. 6, there are 12 suction hoses 616 for eight (8) openings 606 which correspond with eight (8) substrates 110. In an embodiment, two (2) to 20 suction hoses 616 are used. In other embodiments, more than 20 suction hoses 616 are used. In an embodiment, there is a suction hose 616 spaced apart along each end and/or each side of the mask 604.

Figure 7:
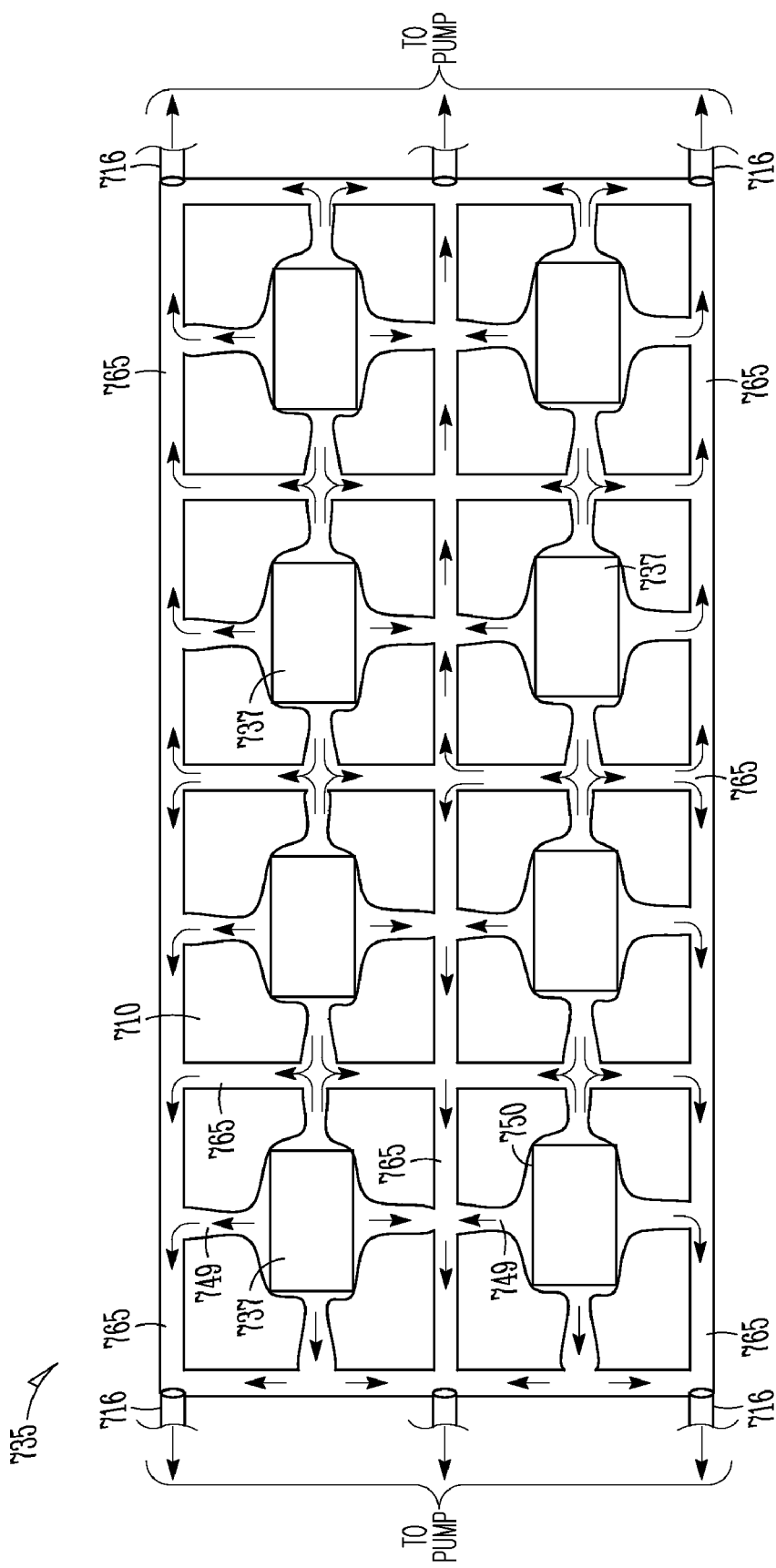
FIG. 7 is a bottom view of a top plate of a mask having channels and vacuum tunnels, the top plate further having a plurality of associated suction hoses in various locations in an embodiment.
Figure 8:
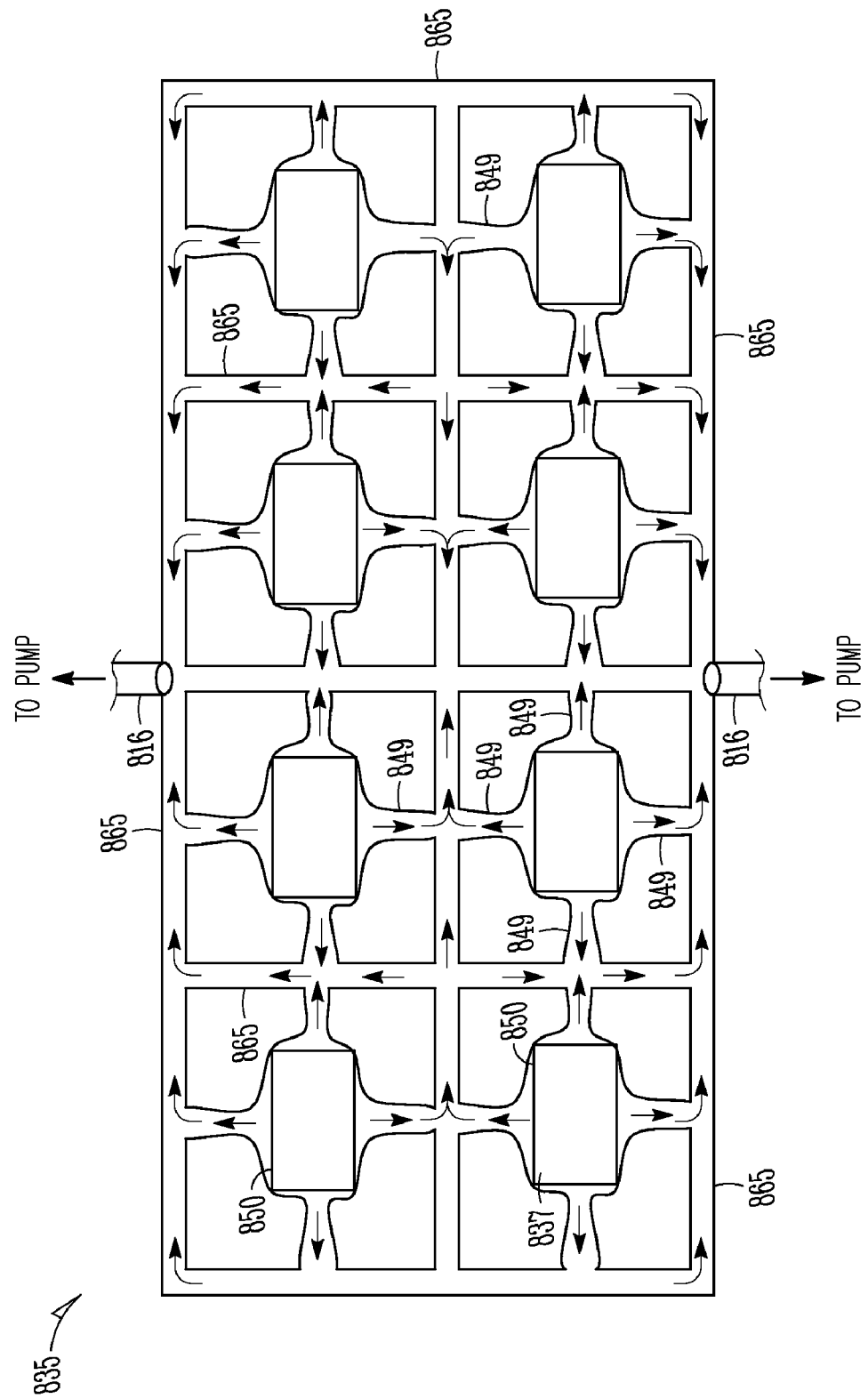
FIG. 8 is a bottom view of a top plate of a mask having channels and vacuum tunnels, the top plate further having a plurality of associated suction hoses in alternative locations in an embodiment.
Figure 9:
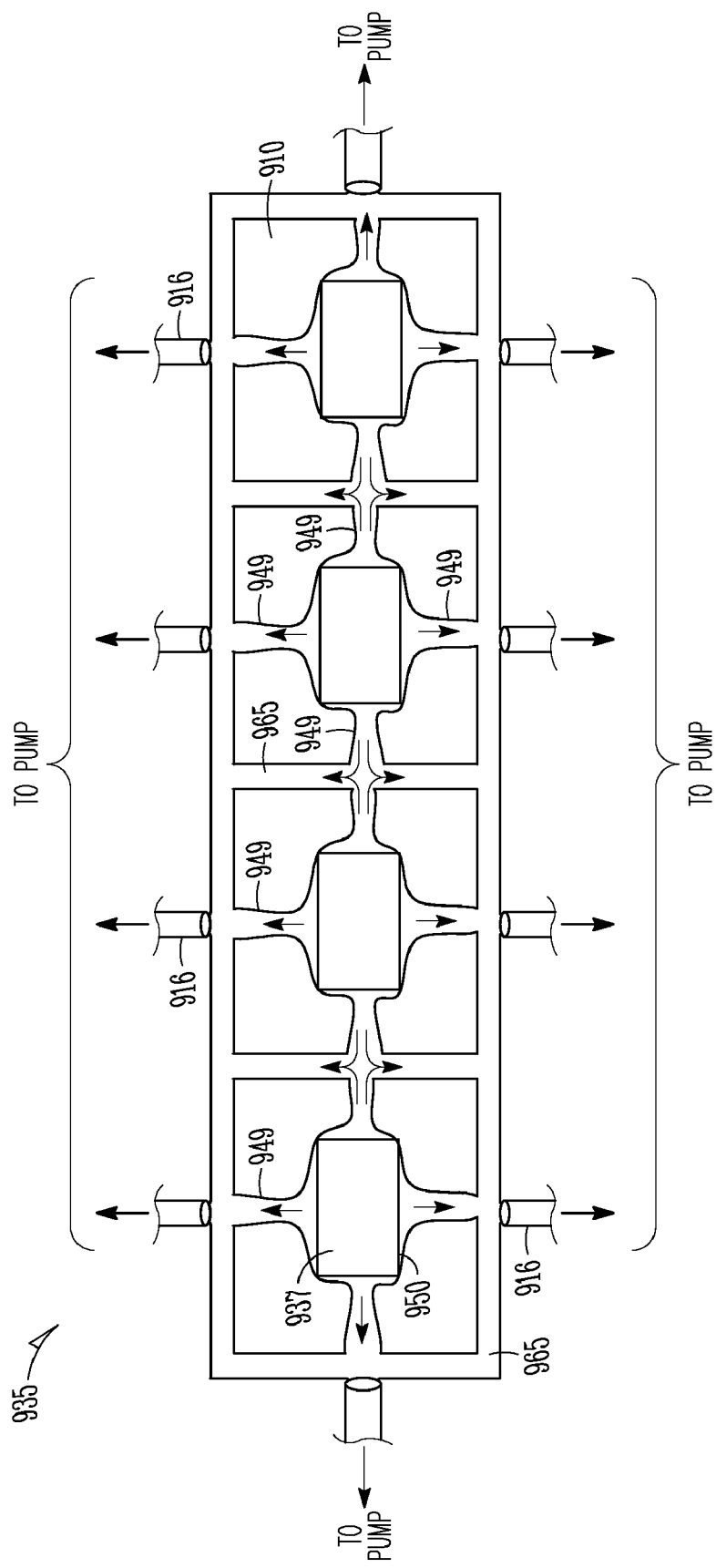
FIG. 9 is a bottom view of an alternative top plate of a mask having channels and vacuum tunnels, the top plate further having a plurality of associated suction hoses in alternative locations in an embodiment.
Figure 10:
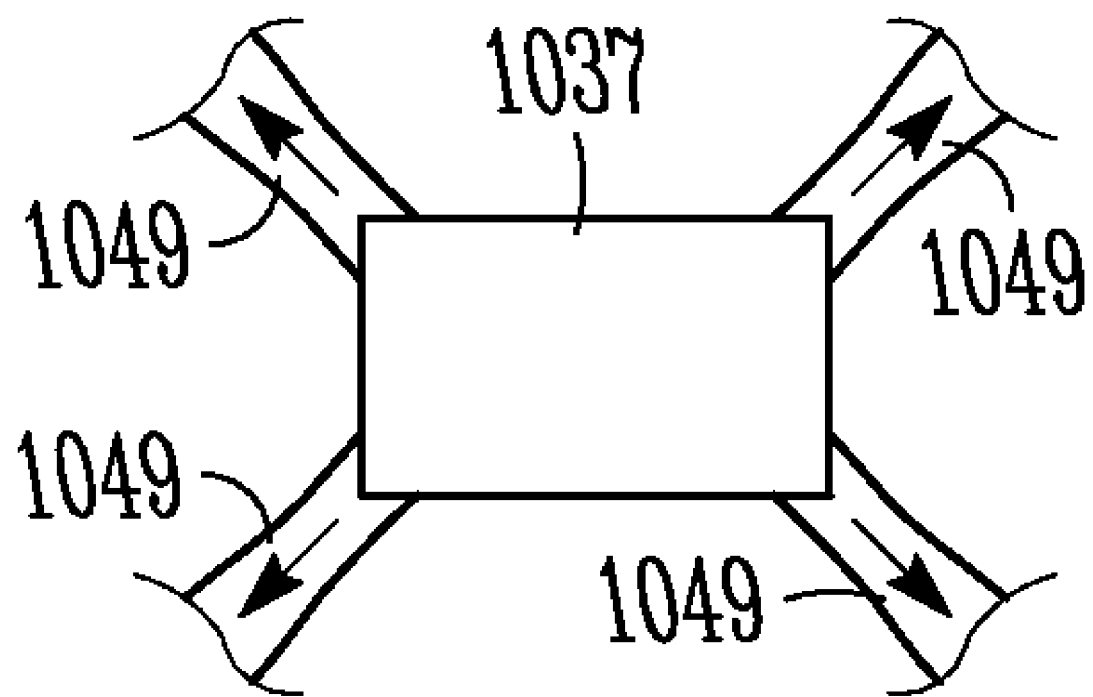
FIG. 10 is a bottom view of a portion of another alternative top plate of a mask, the top plate having alternative channels in an embodiment.

In some embodiments, as shown in FIGS. 7 through 9, the suction hoses 716, 816 and 916, are arranged to cooperate with vacuum tunnels 765, 865 and 965 and may also be located proximate to channels, such as channels 549, 649, 749, 849 and 949 shown in FIGS. 5 through 9, respectively. Suction hoses may also be placed proximate to any portion of the top plate opening 1037. The suction hoses, such as suction hoses 616, 716, 816 and 916 in FIGS. 6 through 9, respectively, may be securely affixed to the mask 604 (or top plate 735, 835 and 935) in any suitable manner, as long as a vacuum can be maintained during the spraying operation. In an embodiment, such as is shown in FIG. 9, the suction hoses 916 are secured near an edge of the top plate 935, such as at an end of a channel. In other embodiments, the suction hoses may extend into one or more vacuum tunnels, such as vacuum tunnels 765, and so forth, and/or into one or more channels, e.g., such as channels 549 and so forth. The suction hoses may be secured in place using any suitable means, such as clips, hooks, and the like. Each suction hose 616, 716, 816 or 916 may be oriented in any suitable direction or plane and not all suction hoses 616, 716, 816 or 916 need to be oriented in the same direction or plane.

In an embodiment, each suction hose, e.g., 616 is oriented in the z-direction. In an embodiment, each suction hose, e.g., 616 is oriented in the x-direction and/or the y-direction. For example, a suction hose, e.g., 616, may be oriented over the top of a mask 604 (or top plate, e.g., 735) so as to draw excess spray flux in an upwardly direction, although the vacuum channels in this embodiment may need to be arranged differently so as not to cause the spray flux to flow away from the opening 106 using gravity assist as discussed above. Alternatively, a suction hose, e.g., 616 may be oriented underneath the mask 104 (or top plate, e.g., 735) so as to draw excess spray flux in a downwardly direction. In such an embodiment, the suction hose or hoses 616 would move in and out from under the mask 604 in between carriers 112.

In the embodiment shown in FIG. 7, there are six (6) suction hoses 716 for eight (8) substrates 710, with three (3) suction hoses 716 located on one end and three (3) suction hoses 716 located on the other end of the top plate 735. The flow of excess spray flux, i.e., flux overspray, is indicated in a general manner via the arrows in these figures. It is to be understood that in some instances a small amount of flux overspray may flow in a direction other than the direction indicated. In the embodiment shown in FIG. 7, the flow is generally towards each end of the top plate 735, away from top plate openings 737 defined by boundary 750.

In the embodiment shown in FIG. 8, there are two (2) suction hoses 816, for eight (8) top plate openings 837 (defined by boundary 850), with each suction hose located on one side or the other of the top plate 835. Again, the general direction of the flux overspray is indicated with arrows. In this embodiment, the flow is generally towards the middle of the top plate 835.

In the embodiment shown in FIG. 9, there is only a single row of substrates 910 for a total of four (4), with four (4) top plate openings 937 (defined by boundary 950). In this embodiment, there are ten (10) suction hoses 916 arranged near the end of each outer channel 949. Flow of flux overspray is generally towards the outside of the top plate 935 as shown.

The various channels described herein may be oriented in relation to the top plate openings, e.g., 937, in any suitable manner. In the embodiments shown in the aforementioned figures, the channels are shown along each side of the top plate opening 937. In the embodiment shown in FIG. 10, the channels 1049 are instead oriented at each corner of the top plate opening 1037. In some embodiments, the viscosity of the spray flux may be such that it collects more at the corners and channels in this location would provide improved drainage of overflow. However, it is understood that even spray flux having a viscosity comparable to water may leave drips 301A on the inner walls 303 of a mask 204 (See FIGS. 3A, 3B and 4).

Figure 11:
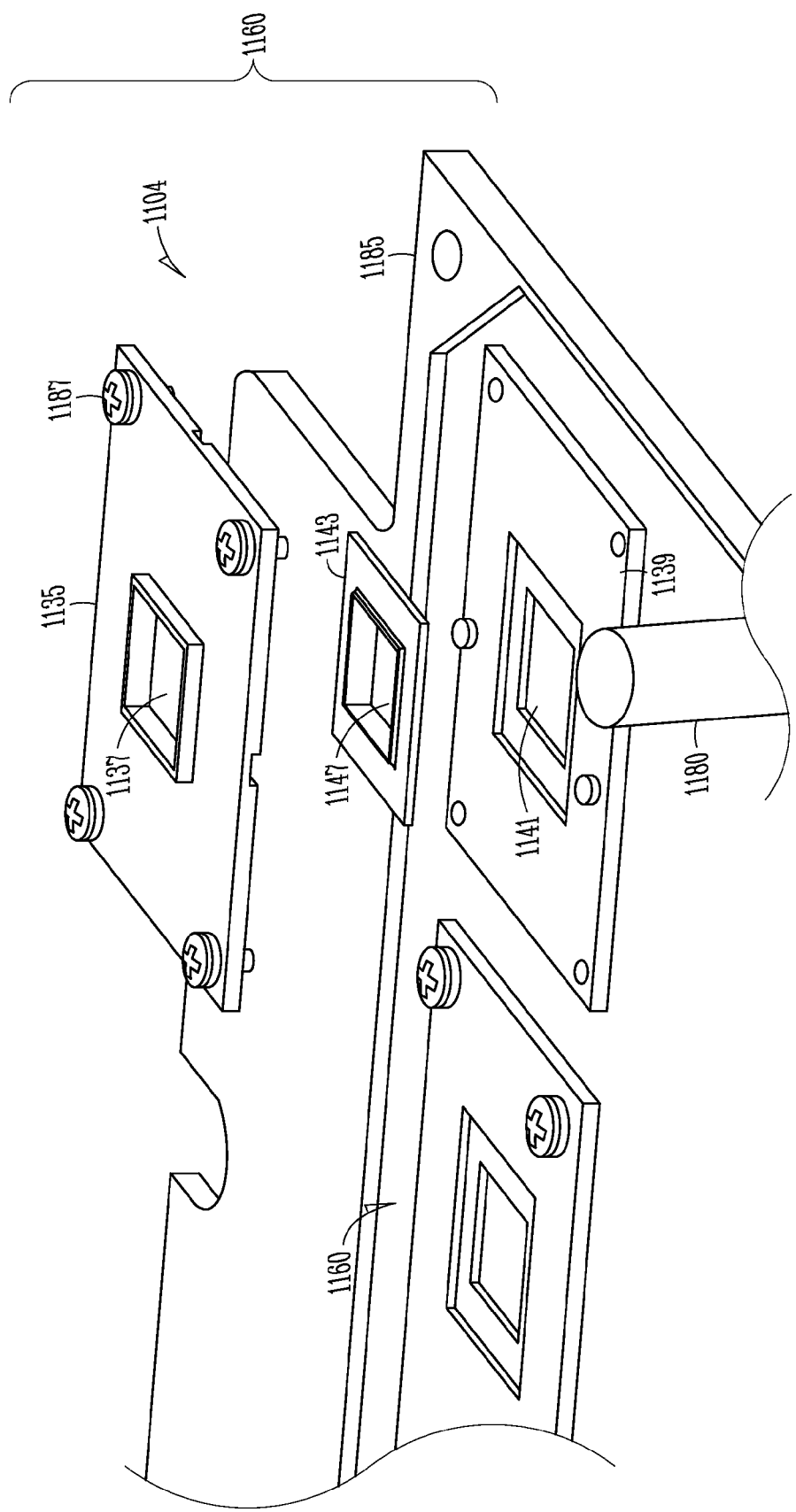
FIG. 11 is an exploded top view of a single stencil assembly for a mask having channels and a mask support in an embodiment.

FIG. 11 is an exploded top view of an alternative mask 1104. In this embodiment the mask 1104 is made up of individual stencil assemblies 1160 comprising a top plate 1135 and a bottom plate 1139 with a stencil element 1143 sandwiched in between. In this embodiment, each stencil assembly 1160 is secured to a mask support 1185 with screws 1187. The entire stencil assembly 1160 and mask support 1185 in turn is secured to a tool (not shown) with suitable connectors, such as pins 1180 (only one shown). In this embodiment, the top plate 1135 and bottom plate 1139 may be made from any suitable metal, such as stainless steel.

Figure 12:
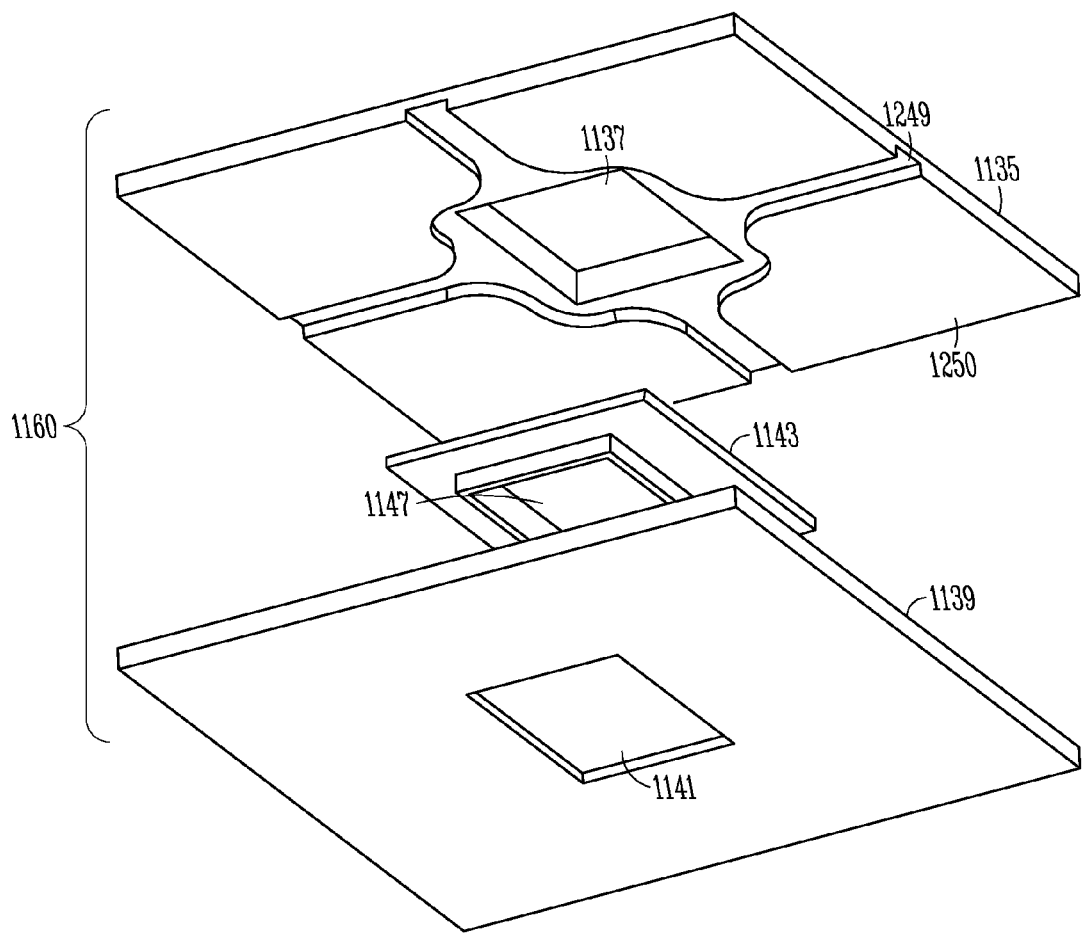
FIG. 12 is an exploded bottom view of an alternative single stencil assembly in an embodiment.

FIG. 12 is an exploded bottom view of a single stencil assembly 1260 of in an embodiment, showing channels 1249 on the bottom surface 1250 of the top plate 1135. The stencil assembly 1160 in FIG. 11 may have such an appearance from the underside. However, in this embodiment, the top and bottom plates 1135 and 1139, respectively, may instead be injection molded and secured to a mask support (not shown) using any suitable type of connector such as snap assemblies, screws, rivets and the like. The channels 1249 may be oriented to direct overflow away from the top plate opening 1137 as described herein. In alternative embodiments in which the vacuum system (not shown) draws flux overspray either upwardly through the top plate opening 1137 or downwardly through the bottom plate opening 1141, the channels 1249 may instead be oriented substantially horizontally or oriented to draw flux overspray towards the openings (1137 or 1141) to be drawn away by the vacuum system (not shown) before being allowed to fall onto the substrate (not shown) below.

Figure 13:
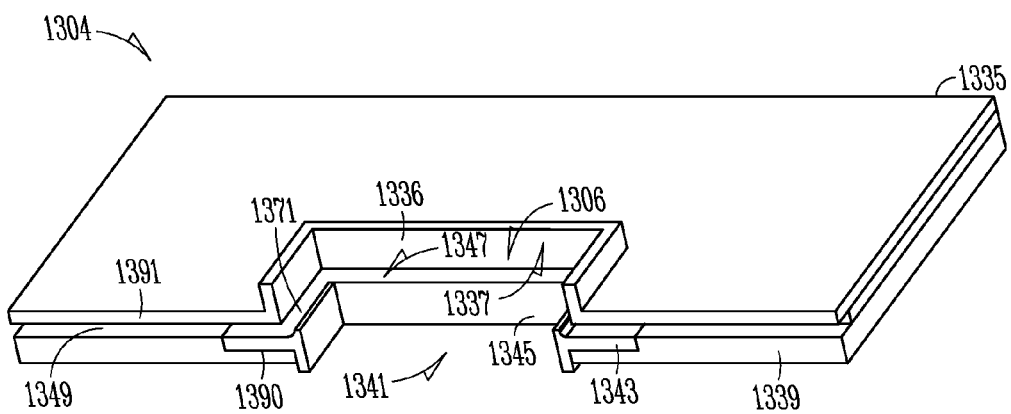
FIG. 13 is a cross-sectional top perspective view of a portion of a mask in an embodiment.

FIG. 13 is a cross-sectional top perspective view of a portion of a mask 1304 comprising a top plate 1335 and a bottom plate 1339, with a stencil element 1343 sandwiched in between. In this embodiment, each stencil element 1343 fits into a groove or cut-away portion 1390 around the bottom plate opening 1341, such that the horizontal plane of a top surface of each stencil element 1343 is in substantially the same horizontal plane of a top surface of the bottom plate 1339. The groove or cut-away portion 1390 shown in FIG. 13 is an L-shaped configuration in the bottom plate 1339 near the bottom plate opening 1341 and may extend any suitable distance along the horizontal plane of the bottom plate 1339. In one embodiment, the groove or cut-away portion 1390 extends less than half-way of a distance between the edge of the bottom plate opening 1341 and an outer edge of the bottom plate 1339. In one embodiment, the groove or cut-away portion 1390 extends about one-fourth to one-third this distance. In this embodiment, the horizontal plane of a bottom surface of each stencil element 1343 is located between the horizontal plane of the top surface of the bottom plate 1339 and a horizontal plane of a bottom surface of the bottom plate 1339. In one embodiment, the horizontal plane of the bottom surface of each stencil element 1343 is about midway between the horizontal plane of the top surface of the bottom plate 1339 and the horizontal plane of the bottom surface of the bottom plate 1339.

The top plate 1335 has top plate inner walls 1336 surrounding a top plate opening 1337. The bottom plate 1339 has a bottom plate opening 1341 aligned with the top plate opening 1337. The stencil element 1343 has a plurality of inner walls 1345 surrounding a stencil element opening 1347 and extending below the horizontal plane of a bottom surface of the stencil element 1343 any suitable distance (such as the distances discussed in FIG. 5). The stencil element opening 1347 is aligned with both the top plate opening 1337 and the bottom plate opening 1341. In an embodiment, the mask 1304 comprises multiple top plate openings 1337 and bottom plate openings 1341 with multiple stencil elements 1343 located in between, similar to the mask 504 shown in FIG. 5.

A lip 1371 around the perimeter of the stencil element opening 1347 is present due to the top plate 1335 having a larger opening 1337 than the stencil element opening 1347 (or the bottom plate opening 1341). The bottom element opening 1341 is of a size which may be comparable to the stencil element opening 1347 or slightly larger in order for the stencil element 1343 to fit securely between the top plate 1335 and the bottom plate 1339, such as in a groove or cut-away portion of the bottom plate 1339 as described above. In an embodiment, the lip 1385 extends around at least a portion of the stencil element opening 1347. In an embodiment, the lip 1385 extends around the entire stencil element opening 1347. In this embodiment, top plate inner walls 1391 are oriented substantially vertically with respect to the bottom plate 1339, although the top plate inner walls 1391 may be oriented in any manner desired in this embodiment or any of the other embodiments described herein. Similarly, the plurality of inner walls 1345 surrounding each stencil element opening 1347 are oriented substantially vertically with respect to the horizontal plane of each stencil element 1341, although may be oriented in any manner relative to the horizontal plane of each stencil element 1341 as long as they can perform their intended function. (The inner walls 545 of each stencil element opening 546 may also be oriented in any suitable manner as can the inner walls 545 of any of the embodiments described herein). Channels 1349 may help to direct flux overspray away from the opening 1306.

Figure 14:
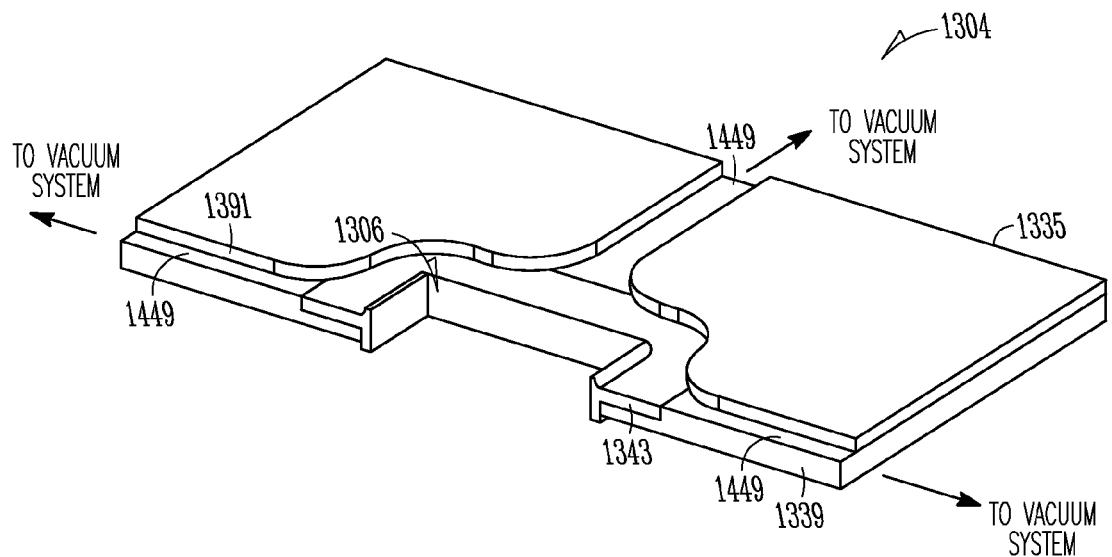
FIG. 14 is a cross-sectional top perspective view of the mask portion for FIG. 13 which includes a cross-sectional view of a top plate in an embodiment.

FIG. 14 is a cross-sectional top perspective view of the portion of the mask 1304 in FIG. 13 that includes a cross-sectional view of the top plate 1335, such that the top plate inner walls (e.g., 1337 in FIG. 13) and a top layer of the top plate 1335 have been cut away to expose channels 1449 and more of the stencil element 1343. In this embodiment, the channels 1449 are oriented to draw flux overspray (not shown) in the directions indicated, away from the opening 1306 and, and towards a vacuum system (if present) or to a container (not shown).

Figure 15:
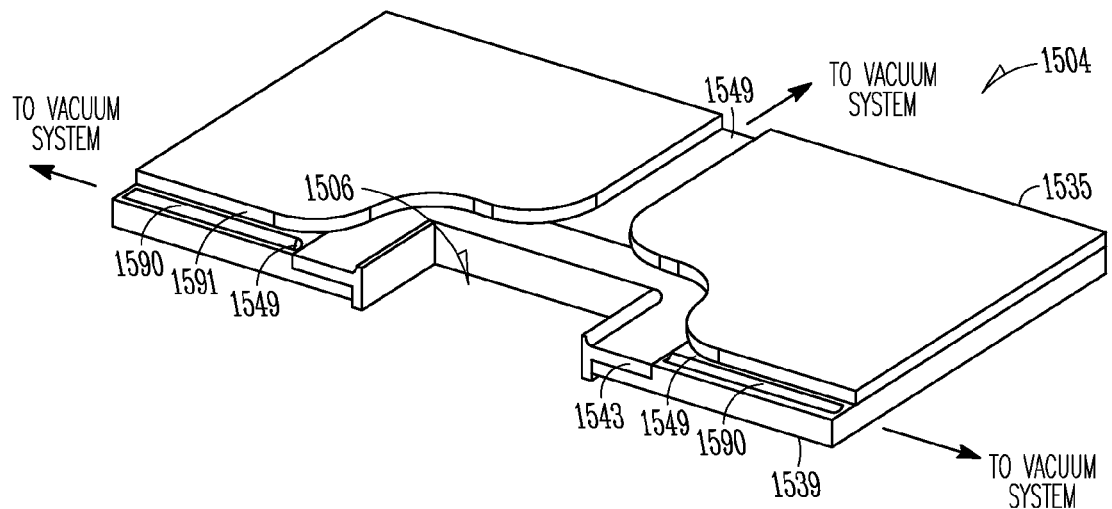
FIG. 15 is a cross-sectional top perspective view of an alternative mask portion which includes a cross-sectional view of a top plate in an embodiment.
Figure 16:
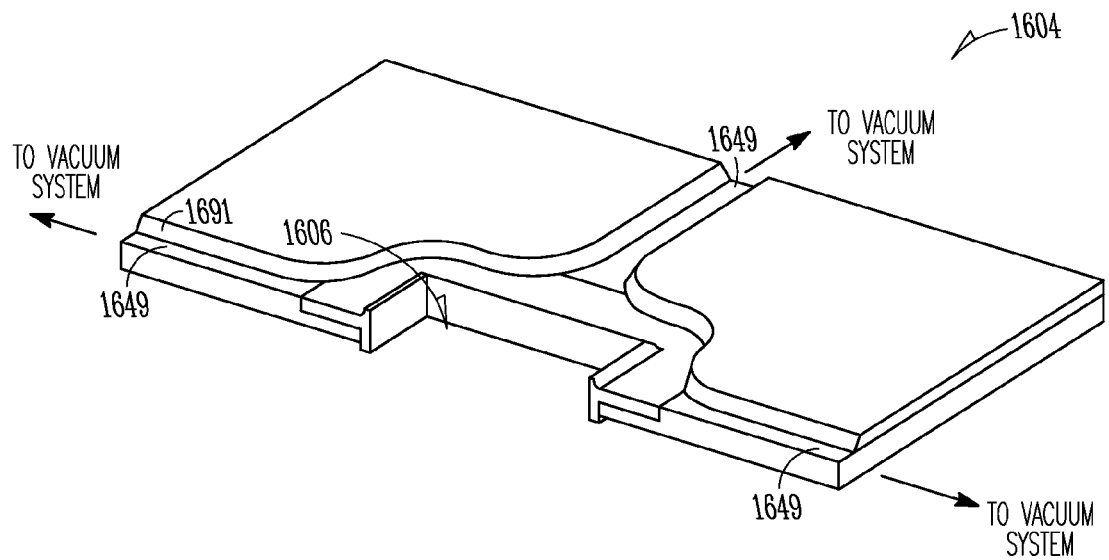
FIG. 16 is a cross-sectional top view of another alternative mask portion which includes a cross-sectional view of a top plate in an embodiment.
Figure 17:
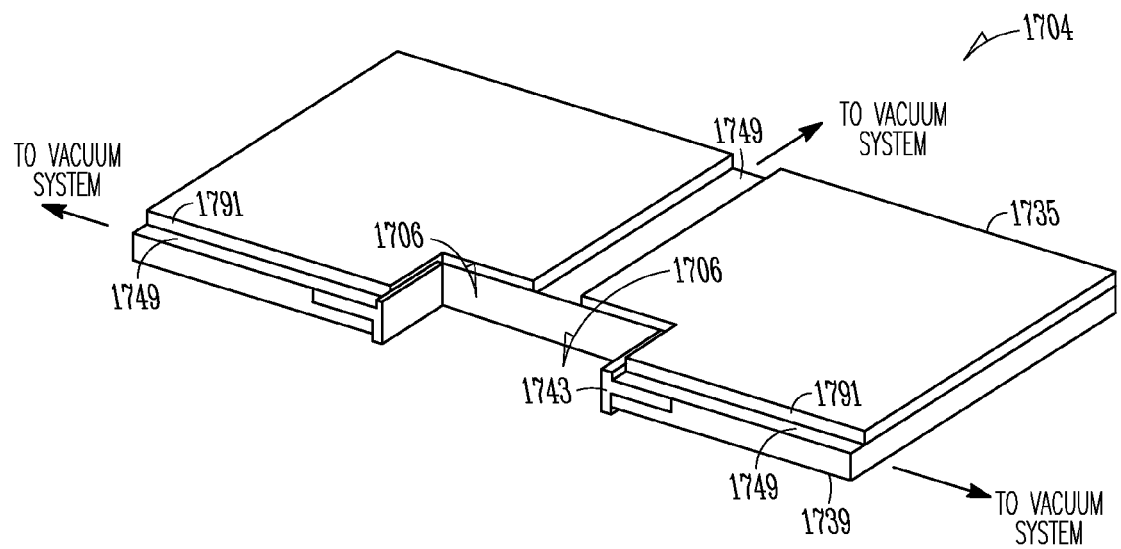
FIG. 17 is a cross-sectional top view of yet another alternative mask portion which includes a cross-section view of a top plate in an embodiment.

FIGS. 15 through 17 are cross-sectional top perspective views of alternative masks that also include a cross-sectional view of the top plate as in FIG. 14. Although shown in each of the aforementioned figures, the use of vacuum assist remains optional in these embodiments, depending on various factors, including the viscosity of the spray flux and flux surface tension. The orientation of the various components discussed may be as described in FIGS. 13 and 14, with flux overspray (not shown) drawn in the directions indicated, i.e., away from the openings 1506, 1606 and 1706 and towards a vacuum system (if present) or to a container (not shown).

FIG. 15 shown an embodiment of a portion of a mask 1504 that further includes canals 1590 carved out of the exposed portion of the bottom plate 1539 on either side of the stencil element 1543 as shown. The canals 1590 may take any suitable configuration that may include a rounded bottom as shown, but could also be v-shaped. Canals 1590 may assist in expediting the flow of flux overspray (not shown) to the vacuum system via the channels 1549 in the top plate 1535. Such an embodiment may be used for any viscosity of spray flux, but may be particularly useful with fluxes having a higher viscosity. In this embodiment, the top plate walls 1591 are oriented substantially vertically with respect to the bottom plate 1539 although the top plate walls 1591 may be oriented in any manner desired.

FIG. 16 shows an embodiment of a portion of a mask 1604 with channel walls 1691 sloped at an angle greater than ninety degrees towards the surfaces below. In other embodiments, any suitable angle may be used. Again, such a configuration may assist in expediting the flow of flux overspray (not shown) to the vacuum system. Such an embodiment may be used for any viscosity of spray flux, but may be particularly useful with fluxes having a higher viscosity. In an embodiment, the canals 1590 of FIG. 15 are used together with the angled channel walls 1691 of FIG. 16. In an embodiment only some of the channel walls 1691 are sloped at an angle greater than ninety degrees. In an embodiment, some or all of the channel walls 1691 are sloped at an angle less than ninety degrees. As with the other embodiments, channels 1649 assist in directing flux overspray in any desired direction, such as to a vacuum system as shown.

FIG. 17 shows an embodiment of a portion of a mask 1704 in which there is no lip around the perimeter of the opening 1709, as was present in FIGS. 14-16 since the vertical wall 1791 of the top plate 1735 is now aligned with the vertical wall of the stencil element 1743 and the bottom plate 1739. Channels 1749 are still present to draw flux overspray away, although with no lip around the perimeter of the opening 1709 it is important that any excess drips (e.g., 301A and 301B in FIGS. 3A and 3B) are removed immediately. As a result, this embodiment is more likely to rely on vacuum assist than the embodiments shown in FIGS. 14-16, which may be able to rely on gravity assist of the various channels alone.

Figure 18:
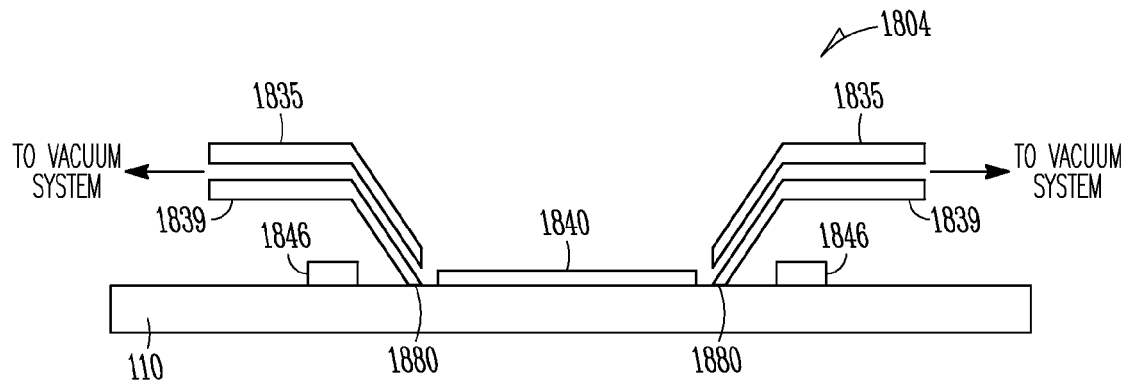
FIG. 18 is a side view of an alternative mask portion in an embodiment.

FIG. 18 is an alternative embodiment showing a side view of a portion of a mask 1804 that includes only a top plate 1835 and a bottom plate 1839, with no stencil element or insert in between, such as the stencil element 543 shown in FIG. 5. In this embodiment, a portion or all of the underside 1880 of the bottom plate 1839, i.e., the contact region between the base plate 1839 and the substrate 110, may receive a surface treatment to prevent wetting and undue adhesion to the substrate 110. Any flux buildup on the mask 1804 may be removed with the vacuum system 114 prior to allowing it to drop onto a die 1840 or be blown onto pads 1846.

Figure 19:
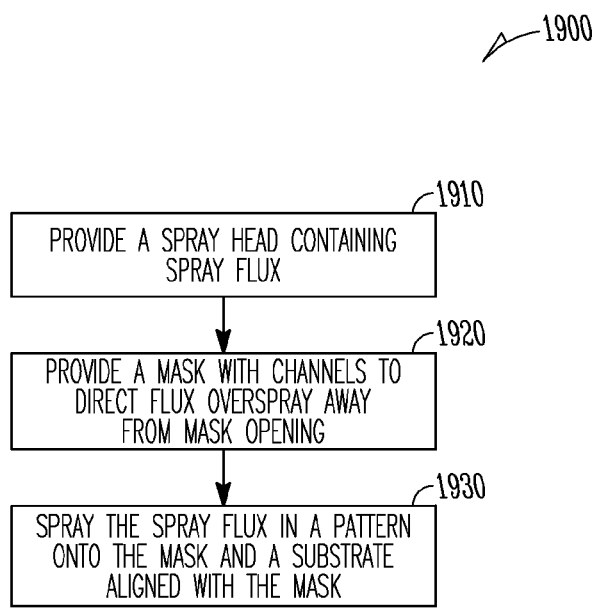
FIG. 19 is a flow chart of a method in an embodiment.

FIG. 19 is a flowchart of a method according to an embodiment. Method 1900 sprays a substrate with spray flux using a mask having channels to direct excess spray flux away from mask openings, thus reducing or eliminating flux overspray from contacting the spray area on the substrate. In method 1900 of FIG. 19, activity 1910 provides a spray head containing spray flux. Activity 1920 provides a mask with channels to direct flux overspray away from mask openings. Activity 1930 sprays spray flux in a pattern onto the mask and a substrate aligned with the mask.

The individual activities of method 1900 do not have to be performed in the order shown or in any particular order. Some activities may be repeated, and others may occur only once. Various embodiments may have more or fewer activities than those shown in FIG. 19. For example, the mask with channels may be provided prior to providing a spray head. Additional activities may include providing a substrate and aligning the substrate with the mask. Other additional activities include providing a container to collect flux overspray and collecting flux overspray in the container. Yet other activities may include providing a vacuum system to draw flux away from the masks and collect in a container.

The above description and the drawings illustrate some specific embodiments sufficiently to enable those skilled in the art to practice these embodiments. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A method comprising:
   providing a spray head containing spray flux;
   providing a mask, the mask including
      one or more stencil assemblies, each stencil assembly having a top plate with at least one opening and one or more channels, extending away from its respective opening, in a bottom surface of the top plate and orthogonal to an axis that is perpendicular to the bottom surface; and
      a bottom plate with at least one opening alignable with the at least one opening in the top plate,
      wherein the one or more channels are oriented to draw flux overspray away from the at least one opening in the mask;
   locating the mask between the spray head and a substrate; and
   spraying spray flux in a pattern onto the mask and the substrate aligned with the mask.

2. The method of claim 1 wherein each stencil assembly further comprises:
   a stencil element configured for location between the top plate and the bottom plate, the stencil element having an opening alignable with the at least one opening in the top plate and the at least one opening in the bottom plate, the stencil element further having a wall protruding from at least one side of the opening, the wall contacting the substrate along at least a portion of a boundary between a region to be sprayed and a no-spray region during spraying.

3. The method of claim 2 wherein the top plate has two or more openings, the bottom plate has two or more openings alignable with the two or more openings in the top plate, and two or more stencil elements are located between the top plate and the bottom plate with each stencil element opening alignable with one of the two or more openings in the top plate and with one of the two or more openings in the bottom plate.

4. The method of claim 1 further comprising arranging a vacuum system to collect flux overspray from the mask, the vacuum system including one or more suction hoses located proximate to the mask.

5. The method of claim 4 wherein the vacuum system comprises:
   a plurality of vacuum tunnels proximate to the one or more channels to direct flux overspray flow from the one or more channels to the one or more suction hoses; and
   one or more containers to collect the flux overspray from the one or more suction hoses.

6. The method of claim 3 wherein each opening in the top plate is larger than the opening in the corresponding stencil element and bottom plate, forming a lip that extends around at least a portion of the stencil element opening.

7. The method of claim 6 further comprising pressing the stencil element against the substrate by one or more spring elements.

8. The method of claim 7 wherein the one or more spring elements comprise a plurality of spring clips.

9. The method of claim 2 further comprising:
   spraying the substrate with spray flux while the mask is in contact with the boundary portion of the substrate.

10. The method of claim 1 further comprising:
    prior to spraying, securing the mask to a support element;
    aligning regions to be sprayed on the substrate with openings in the mask;
    moving the substrate into contact with the mask; and
    after spraying, moving the substrate away from the mask.

11. An apparatus comprising:
    a flux sprayer to spray a substrate; and
    a mask including
       one or more stencil assemblies, each stencil assembly having a top plate with at least one opening and one or more channels, extending away from its respective opening, in a bottom surface of the top plate and orthogonal to an axis that is perpendicular to the bottom surface; and
       a bottom plate with at least one opening alignable with the at least one opening in the top plate,
       wherein the one or more channels are oriented to draw flux overspray away from the at least one opening in the mask, the mask locatable between the flux sprayer and the substrate.

12. The apparatus of claim 11 wherein each stencil assembly further comprises a stencil element located between the top plate and the bottom plate, the stencil element having an opening alignable with the at least one opening in the top plate and the at least one opening in the bottom plate, the stencil element further having a wall protruding from at least one side of the opening.

13. The apparatus of claim 12 further comprising:
    a vacuum system to collect flux overspray from the mask, the vacuum system including:

a plurality of vacuum tunnels proximate to the one or more channels in the one or more stencil assemblies to direct flux overspray flow from the one or more channels to one or more suction hoses;

a pump to draw flux overspray into the one or more suction hoses; and one or more containers to collect the flux overspray from the one or more suction hoses.

14. The apparatus of claim 12 wherein each opening in the top plate is larger than the opening in the corresponding stencil element and bottom plate, forming a lip in each stencil assembly that extends around at least a portion of the stencil element opening.

15. A mask comprising:

one or more stencil assemblies, each stencil assembly having a top plate with at least one opening and one or more channels, extending away from its respective opening, in a bottom surface of the top plate and orthogonal to an axis that is perpendicular to the bottom surface; and a bottom plate with at least one opening alignable with the at least one opening in the top plate, wherein the one or more channels are oriented to draw flux overspray away from the at least one opening in the mask, the mask locatable between a flux sprayer and a substrate.

16. The mask of claim 15 wherein the top plate and bottom plate are thermoplastic.

17. The mask of claim 15 further comprising a stencil element located between the top plate and the bottom plate of each of the one or more stencil assemblies, wherein the stencil element has an opening alignable with the at least one opening in the top plate and the at least one opening in the bottom plate, the stencil element having a wall protruding from at least one side of the stencil element opening.

18. The mask of claim 17 wherein the top plate, bottom plate and stencil element are securable to a support element with a spring element.

19. The mask of claim 17 wherein the stencil element comprises a non-stick material selected from the group consisting of nylon, urethane, silicone, and thermoplastic.

20. The mask of claim 17 wherein the stencil element comprises polytetrafluoroethylene.

21. The mask of claim 15 wherein the one or more channels extend from one or more sides, respectively, of each of the plurality of openings, from one or more corners, respectively, of each of the plurality of openings, or both from different sides and different corners.

22. The mask of claim 21 further comprising a plurality of vacuum tunnels located proximate to the one or more channels.

23. A system comprising:

a spray head;

a carrier to contain a substrate to be sprayed with spray flux;

a mask including a top plate having a plurality of openings and a bottom plate with a plurality of corresponding openings, wherein each of the plurality of openings in the top plate is aligned with each of the corresponding openings in the bottom plate, wherein each of the plurality of openings comprises four sides, wherein each of the plurality of openings in the top plate has one or more channels, extending away from its respective opening, in and parallel to a bottom surface of the top plate, wherein the one or more channels extend from one or more sides, respectively, of the plurality of top plate openings, from one or more corners of the plurality of top plate openings, or both from different sides and different corners of the plurality of top plate openings, wherein the one or more channels are oriented to draw flux overspray away from the plurality of openings in the mask, the mask located between the spray head and the substrate, the mask comprising a wall to contact the substrate along at least a portion of a boundary between a region to be sprayed and a region to be masked; and a support element to align the substrate with the spray head.

24. The system recited in claim 23 wherein the support element includes a rail to support the mask.

25. The system of claim 23 further comprising a plurality of stencil elements located between the top plate and the bottom plate, each of the plurality of stencil elements having an opening aligned with one of the plurality of openings in the top plate and one of the corresponding openings in the bottom plate.

26. The system of claim 25 wherein each of the plurality of openings in the top plate is larger than each of the plurality of corresponding openings in the bottom plate, further wherein each of the plurality of openings in the top plate is larger than each stencil element opening.

27. The system of claim 23 further comprising one or more suction hoses connected to the mask.

28. A method comprising:

providing a mask, the mask including one or more stencil assemblies, each stencil assembly having a top plate with at least one opening and one or more channels, extending away from its respective opening, in a bottom surface of the top plate and orthogonal to an axis that is perpendicular to the bottom surface; and a bottom plate with at least one opening alignable with the at least one opening in the top plate, wherein the one or more channels are oriented to draw flux overspray away from the at least one opening in the mask;

locating the mask between a flux sprayer and a substrate; and spraying the substrate with the flux sprayer.

* * * * *